(12) United States Patent
Wild et al.

(10) Patent No.: US 6,329,807 B1
(45) Date of Patent: Dec. 11, 2001

(54) DEVICE FOR THE RECOGNITION OF A DEFECTIVE SIGNAL

(75) Inventors: Ernst Wild, Oberriexingen; Manfred Pfitz, Vaihingen, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/242,275

(22) PCT Filed: May 9, 1998

(86) PCT No.: PCT/DE98/01270

§ 371 Date: Feb. 12, 1999

§ 102(e) Date: Feb. 12, 1999

(87) PCT Pub. No.: WO99/00593

PCT Pub. Date: Jan. 7, 1999

(30) Foreign Application Priority Data

Jun. 26, 1997 (DE) .............................. 197 27 204

(51) Int. Cl.$^7$ ...................................................... G01R 23/65
(52) U.S. Cl. ........................................................ 324/76.29
(58) Field of Search ........................... 324/76.29, 207.18, 324/207.19; 123/568.22, 488, 396, 399, 479, 179.18, 339.2, 339.21, 352; 701/104; 73/119 A, 118.1, 118.2

(56) References Cited

U.S. PATENT DOCUMENTS 4,199,799 * 4/1980 Ostenso et al. ........................ 361/78
5,223,830 * 6/1993 Romes ............................. 340/870.35
5,706,791 * 1/1998 Mezger et al. ....................... 123/571

FOREIGN PATENT DOCUMENTS

OS 43 44 633    12/1993  (DE) .

* cited by examiner

Primary Examiner—Safet Metjahic
Assistant Examiner—Etienne LeRoux
(74) Attorney, Agent, or Firm—Michael J. Striker

(57) ABSTRACT

The device for detecting an erroneous signal characteristic of a load on an internal combustion engine that includes first and second differentiators (10,16) with delay devices that generate corresponding output signals (S11, S22) from respective load signals (S1,S2); first and second magnitude-forming devices (14,17) connected with the first and second differentiators respectively to generate respective magnitude signals from the corresponding output signals (S11,S22) first and second low-pass filters (15, 18) connected with the first and second magnitude-forming devices respectively to generate first and second DC voltage signals (MW1,MW2); a subtracting device (19) for subtracting the first and second DC voltage signals (MW1,MW2) from each other to generate a difference signal (D); and comparison devices (20, 23) for generating a first error signal or a second error signal when the difference signal (D) is greater than a predetermined threshold (SW1) or less than a negative of the predetermined threshold (−SW1) respectively, so that the first error signal indicates the main load signal is faulty and the second error signal indicates the auxiliary load signal is faulty.

4 Claims, 1 Drawing Sheet

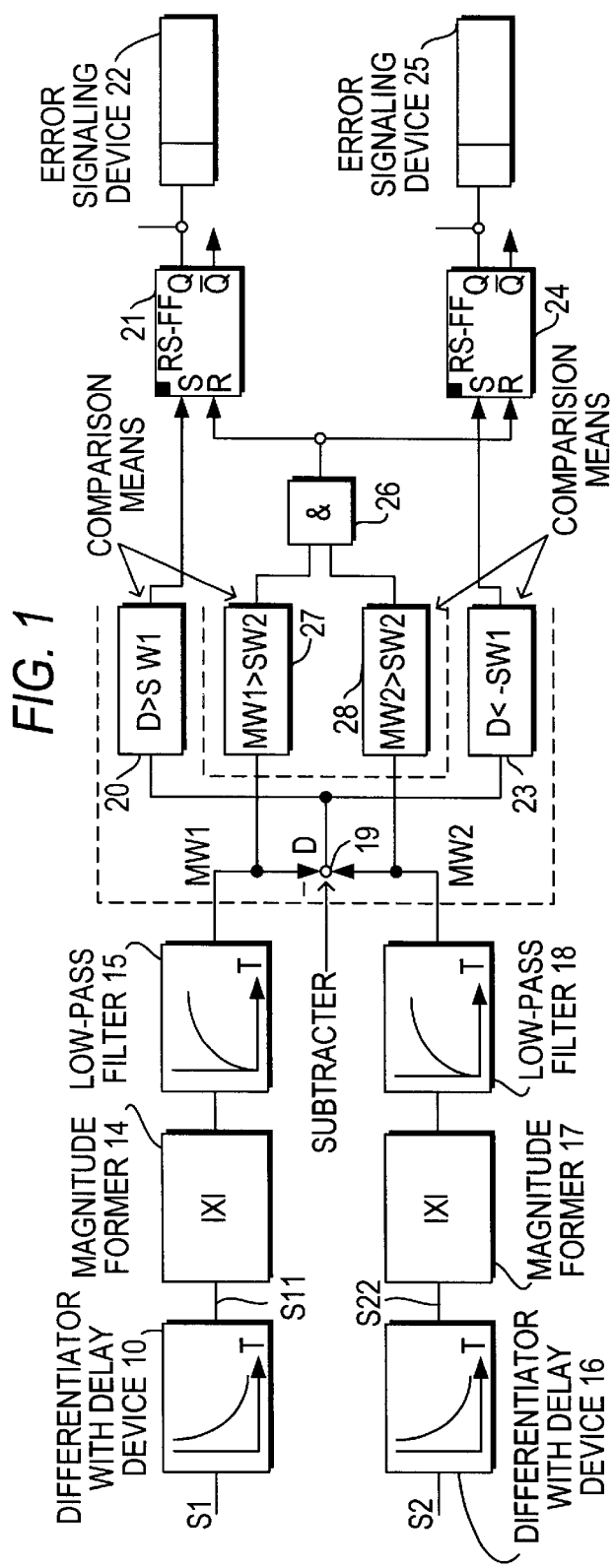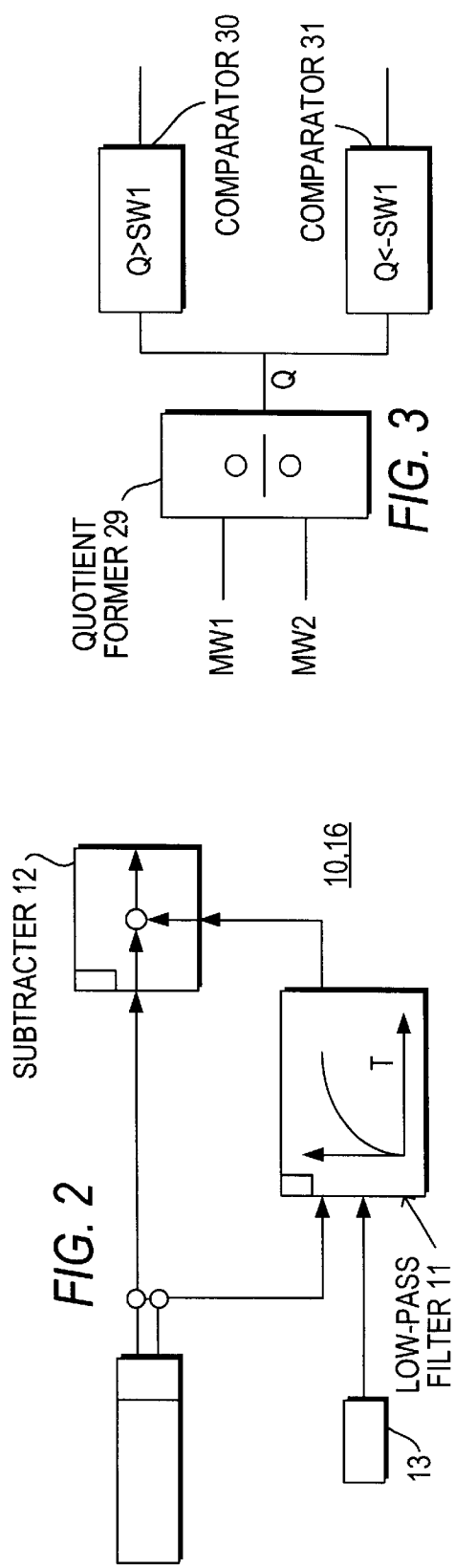

DEVICE FOR THE RECOGNITION OF A DEFECTIVE SIGNAL

BACKGROUND OF THE INVENTION

Field of the Invention

The present invention relates of a device for detecting an erroneous signal characteristic of a load on an internal combustion engine and, more particularly, to a device comprising a first and second load signal generating means and means for recognizing whether or not the first and second load signal are characteristic of the same measured load value.

In the course of determining an essential measurement value it may become necessary to employ two sensor systems, which operate independently of each other, for the determination. It is then possible by means of such redundant systems to detect an error by means of a comparison of the signals provided by the sensor systems, for example if a signal exceeds an upper threshold value or falls below a lower threshold value.

However, it is also further possible to compare both signals and to monitor, for example, the distance between two signals in order to detect an error if the difference between the two signals exceeds a threshold value. Such a plausibility check is performed in DE-OS 43, 44 633, for example.

With this known plausibility check, the so-called main load signal and the so-called secondary load signal are compared with each other in connection with the load registration in an internal combustion engine. Here, the main load signal is determined by directly registering the air flow aspirated by the internal combustion engine with the aid of an air flow sensor. The registration of the main load signal can also be performed indirectly with an induction pipe pressure sensor. In the course of this, the aspirated quantity of fresh air is calculated, using the gas equation and taking into consideration the temperature of the aspirated air, the remaining gas portion and the cylinder stroke volume. The secondary load signal is formed in both methods (pressure sensor, or respectively air flow sensor) by evaluating the rpm and the angular position of the throttle of the internal combustion engine, for example with the aid of a throttle potentiometer. The main load signal as well as the secondary load signal must correspond to each other to a large extent when the air flow sensor or the pressure sensor, or respectively the throttle potentiometer operate correctly and are optimally matched. However, if deviations nevertheless occur, it is possible to conclude that one of the two sensor systems is in error.

SUMMARY OF THE INVENTION

The device in accordance with the invention for detecting an erroneous signal can, in an advantageous manner, surely and dependably recognize when one of two sensors which register the same measurement value provides an erroneous output signal. In this case it is particularly advantageous that an erroneous signal is recognized even if it lies within a range which is per se valid. It is therefore possible to recognize if one of the two sensors emits a constant signal which is still plausible, although the value to be measured changes, i.e. the lack of dynamics on the defective signal path is recognized.

These advantages are achieved in that the two signals are not directly compared with each other, but are initially filtered and the magnitude of the filtered signal is respectively formed. By forming the difference between the magnitudes of the filtered signals it is possible to generate particularly dependable conditions which are used for detecting errors. Thus it is possible in particular to detect an error in an advantageous manner by evaluating the sign of the difference of the two signals for error recognition. Therefore the error recognition, or respectively the plausibility monitoring, is based in an advantageous manner on the variance between the two signals. In comparison with the monitoring known from DE-OS 43 44 633, which is based on a comparison of signal levels, this monitoring has the advantage of being more dependable and of operating dependably even in case of small error functions of a sensor.

Further advantages are achieved by the features of the preferred embodiments. A particular advantage lies in that it is also possible to detect, which of the two signals is erroneous. This advantage is achieved in that, following the difference formation, a special plausibility check using logical means is performed.

In an alternative embodiment instead of a difference formation of the magnitude of the filtered signals, it is also possible to provide a quotient formation. The comparison of the quotient with at least one threshold value also makes the detection of an error possible.

BRIEF DESCRIPTION OF THE DRAWING

The objects, features and advantages of the invention will now be illustrated in more detail with the aid of the following description of the preferred embodiments, with reference to the accompanying figures in which:

FIG. 1 is a block diagram of a first embodiment of a device for detecting an erroneous load signal characteristic of a load on an internal combustion engine;

FIG. 2 is a detailed schematic diagram of a differentiator with delay device which is part of the device shown in FIG. 1; and FIG. 3 is a detailed schematic diagram of a part of an alternative embodiment of the device for detecting an erroneous load signal according to the invention.

DESCRIPTION OF THE PREFERRED EMBODIMENTS

The invention will be explained by means of an exemplary embodiment corresponding to the load detection of an internal combustion engine that is shown in FIG. 1. However, the invention basically is not limited to the load detection in an internal combustion engine, instead it can be expanded to all physical values, wherein the prerequisite is that the respective physical values are detected by means of two different sensors.

Load is a very important value in the control of an internal combustion engine. Load is understood to be, for example, the aspirated air quantity. Conventionally the determination of the aspirated air quantity is performed in two different ways. For one, an air flow sensor or a induction pipe pressure sensor is disposed in the induction pipe of the internal combustion engine. Air flow sensors make use of the principle that the flowing air cools a heated surface. The functioning of hot film air flow sensors is known and will not be explained in detail here. The output signal generated by the air flow sensor is designated the so-called main load signal and is used by the control device of the internal combustion engine as an important control value.

Since the load signal is such an important value, it is also determined in accordance with a second method. The load signal which is determined in accordance with the second method is customarily designated as a secondary load signal, as a rule it is determined as a function of measured throttle angles, the rpm of the internal combustion engine and, if necessary, other values. At an optimal matching of the two load detections and with correct functioning of both sensors, the main load signal and the secondary load signal must be nearly identical. If this is not the case, at least one of the two signals must be erroneous. Dependable error recognition is performed in the following manner:

The signal S1 provided by the air flow sensor, or respectively the pressure sensor, which is the main load signal or main charging signal, is initially supplied to a differentiator 10 as shown in FIG. 1. The differentiator with a delay device 10 essentially includes a low-pass filter 11 and a subtracter 12 as shown in FIG. 2. In this case the signal S1 is conducted at one time directly to the subtracter 12 and at one time over the low-pass filter 11. The signal filtered by the low-pass filter is subtracted from the signal S1 in the subtracter 12. A low-pass filter, whose properties can be changed, is advantageously used as the low bandpass filter 11. To this end the filter constant 13, for example, is changed.

The differentiated signal S11 is conducted to a magnitude former 14. The dynamic portion of the differentiated main charging signal S11 is rectified by means of the magnitude forming. In a subsequent filter, for example a low-pass filter 15, the pulsating direct voltage signal is smoothed. Thus a direct voltage MW1, which is proportional to the input signal dynamics, is available as the filter compensation signal.

The secondary charging signal, or respectively secondary load signal, S2 is further processed in the same manner as the main charging signal. It is therefore initially conducted to a differentiator with a delay device 16, which also includes a low-pass filter and a subtracter. The differentiated signal S22 is rectified in the magnitude former 17 and is smoothed in the low-pass filter 18. In this way a direct voltage MW2, which is proportional to the input signal dynamics of the signal S2, is generated at the output of the low-pass filter 18.

The two signals processed in this manner, or respectively the voltages MW1 and MW2, are conducted to a subtracter 19, which forms the difference voltage D between the two voltages. The signal difference voltage D is essentially evaluated for error detection.

If both signals S1 and S2 are present and signal dynamics exist, a difference voltage of D=0 V appears at the output of the subtracter 19. In case of a defect in the charging replacement signal S2, for example a defect of the throttle potentiometer, the voltage of the low-pass filter 18 will drop to 0 V. But with signal dynamics, a positive voltage will continue to be applied to the low-pass filter 15 of the main charging signal. If the output voltage D of the subtracter 19 is compared in a comparison means 20, for example a comparator, with a threshold value, an error can be detected when the voltage exceeds the threshold value SW1. When the threshold value SW1 is exceeded, a defective charging replacement signal is recognized by setting a flip-flop 21 and an error report 22 is issued.

If a defect occurs in the main charging signal, for example if the air flow sensor, or respectively pressure sensor, do not at all or not correctly operate, or with a break in the signal path, a negative output voltage occurs at the output of the subtracter 19. By comparing the voltage D with a negative threshold value −SW1, again an error can be detected if the voltage D falls below the threshold value −SW1. The comparison takes place in block 23, by means of a subsequent setting of a flip-flop 24 an error condition 25 can be activated, which signals that an error must be present in the main charging signal branch.

An error block can be constructed via the two flip-flops 21 and 24 with the aid of the AND gate 26, which is connected via the two comparison devices 27 and 28 with the outputs of the two low-pass filters 15 and 18. Such an error block is necessary since otherwise a detected charging signal error would be recognized as repaired in case of a decreasing dynamic of the signal branch which is still active. However, repair can only take place at high signal dynamics after exceeding a repair threshold of both signals. To this end, the voltage MW1 is monitored in the comparison devices 27 and 28 to determine whether it exceeds a threshold value SW2. The voltage SW2 is also monitored in the comparison device 28 to determine whether it exceeds the threshold value SW2. Only if both voltages are higher than the threshold value SW2 does the AND gate 26 switch over, so that an appropriate signal reaches the two R inputs of the flip-flops 21 and 24.

The structure of the arrangement in accordance with FIG. 1 can be provided by means of discrete components, but can also be achieved by means of software in a computer device, for example in the control device of the internal combustion engine. The threshold values SW1 and SW2 should be selected to meet the requirements. Plausibility monitoring in accordance with the invention is principally based on the evaluation of the variance between the two signals.

In an alternative embodiment instead of the difference formation in the subtracter 19, it would also be possible to perform a quotient formation of the voltages MW1 and MW2 as shown in FIG. 3. Since, as a function of occurring errors, the quotient becomes either positive or negative, a comparison 30 or 31 could be performed after the quotient formation 29, wherein the quotient Q is monitored to determine whether it is greater than a threshold value SW1 or less than a threshold value SW1. When the threshold value SW1 is exceeded, an error of the main charging signal would be detected, and if it falls below the threshold value −SW1, an error of the secondary charging signal would be detected.

What is claimed is:

1. A device for detecting an erroneous load signal characteristic of a load on an internal combustion engine, said device comprising a first differentiator (10) with a first delay means, said first differentiator (10) with the first delay means receiving a main load signal (S1) indicative of the load on the internal combustion engine and generating a main differentiator output signal (S11);

a second differentiator (16) with a second delay means, said second differentiator (16) with the second delay means receiving an auxiliary load signal (S2) indicative of the load on the internal combustion engine and generating an auxiliary differentiator output signal (S22);

a first magnitude-forming device (14) receiving the main differentiator output signal (S11) and generating a first magnitude signal;

a second magnitude-forming device (17) receiving the auxiliary differentiator output signal (S22) and generating a second magnitude signal;

a first low-pass filter means (15) receiving said first magnitude signal and generating a first DC voltage signal (MW1) dependent on the main load signal (S1);

a second low-pass filter means (18) receiving said second magnitude signal and generating a second DC voltage signal (MW2) dependent on the auxiliary load signal (S2);

a difference-forming means (19) for subtracting said first and second DC voltage signals (MW1,MW2) from each other to generate a difference signal (D);

comparison means (20,23) for generating a first error signal or a second error signal when the difference signal (D) is greater than a predetermined threshold (SW1) or less than a negative of the predetermined threshold (−SW1) respectively, whereby said first error signal indicates said main load signal is faulty and said second error signal indicates said auxiliary load signal is faulty.

2. The device as defined in claim 1, further comprising first and second flip-flops (21,24) connected with said comparison means (20,23) so as to receive said first error signal and said second error signal respectively as input signals, additional comparison means (27,28) for comparing said first and second DC voltage signals (MW1,MW2) respectively with a second predetermined threshold (SW2) and for producing corresponding comparison signals when said first and second DC voltage signals both exceed said second predetermined threshold and AND gate (26) connected to said additional comparison means to receive said comparison signals respectively and to generate an AND output signal when both of said first and second DC voltage signals exceed said second predetermined threshold, said AND gate (26) being connected with said flip-flops so that said AND output signal is fed to an R input of each of said flip-flops (21,24), so that said flip-flops pass said first or said second signal only if said second predetermined threshold is exceeded by both of said signals.

3. A device for detecting an erroneous load signal characteristic of a load on an internal combustion engine, said device comprising a first differentiator (10) with a first delay means, said first differentiator (10) with the first delay means receiving a main load signal (S1) indicative of the load on the internal combustion engine and generating a main differentiator output signal (S11);

a second differentiator (16) with a second delay means, said second differentiator (16) with the second delay means receiving an auxiliary load signal (S2) indicative of the load on the internal combustion engine and generating an auxiliary differentiator output signal (S22);

a first magnitude-forming device (14) receiving the main differentiator output signal (S11) and generating a first magnitude signal;

a second magnitude-forming device (17) receiving the auxiliary differentiator output signal (S22) and generating a second magnitude signal;

a first low-pass filter means (15) receiving said first magnitude signal and generating a first DC voltage signal (MW1) dependent on the main load signal (S1);

a second low-pass filter means (18) receiving said second magnitude signal and generating a second DC voltage signal (MW2) dependent on the auxiliary load signal (S2);

a quotient-forming means (29) for dividing said first and second DC voltage signals (MW1,MW2) from each other to generate a quotient signal (Q);

comparison means (30,31) for generating a first error signal or a second error signal when the quotient signal (Q) is greater than a predetermined threshold (SW1) or less than a negative of the predetermined threshold (−SW1) respectively, whereby said first error signal indicates said main load signal is faulty and said second error signal indicates said auxiliary load signal is faulty.

4. The device as defined in claim 1 or 3, wherein said main load signal is generated according to throttle position and speed of the internal combustion engine and said auxiliary load signal is produced by an air flow sensor.

* * * * *